United States Patent
Kataoka

(10) Patent No.: US 9,882,582 B2
(45) Date of Patent: Jan. 30, 2018

(54) NON-TRANSITORY COMPUTER-READABLE RECORDING MEDIUM, ENCODING METHOD, ENCODING DEVICE, DECODING METHOD, AND DECODING DEVICE

(71) Applicant: FUJITSU LIMITED, Kawasaki-shi, Kanagawa (JP)

(72) Inventor: Masahiro Kataoka, Kamakura (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/285,060

(22) Filed: Oct. 4, 2016

(65) Prior Publication Data

US 2017/0099064 A1 Apr. 6, 2017

(30) Foreign Application Priority Data

Oct. 5, 2015 (JP) ................................. 2015-197944

(51) Int. Cl.
*H03M 7/00* (2006.01)
*H03M 7/30* (2006.01)
(Continued)

(52) U.S. Cl.
CPC ...... *H03M 7/3088* (2013.01); *G06F 17/2247* (2013.01); *G06F 17/2252* (2013.01);
(Continued)

(58) Field of Classification Search
CPC ...... H03M 7/40; H03M 7/30; H03M 13/3761; H03M 7/3084; H03M 7/4006; H03M 7/425; H03M 7/6076
(Continued)

(56) References Cited

U.S. PATENT DOCUMENTS 5,870,036 A * 2/1999 Franaszek ........... H03M 7/3086
341/51
5,872,530 A * 2/1999 Domyo ............... H03M 7/3088
341/106

(Continued)

FOREIGN PATENT DOCUMENTS

EP 0 729 237 A2 8/1996
EP 2 838 037 A2 2/2015
(Continued)

OTHER PUBLICATIONS

Extended European Search Report dated Feb. 24, 2017 in Patent Application No. 16192341.2.
(Continued)

*Primary Examiner* — Linh Nguyen
(74) *Attorney, Agent, or Firm* — Oblon, McClelland, Maier & Neustadt, L.L.P.

(57) ABSTRACT

An encoding device generates static-encoded data from input text data, utilizing a static dictionary that associates a character strings and static codes, respectively the static-encoded data including a plurality of static codes corresponding to a plurality of character strings that are registered in the static dictionary, generates dynamic-encoded data from the static-encoded data by encoding a character string or the static code that occurs more than once in the static-encodes data into a dynamic code, creates a dynamic dictionary associating character strings or static codes with corresponding dynamic codes, respectively and creates a Huffman tree and data of a leaf in the Huffman tree based on an occurrence frequency of the dynamic codes and the static codes in the input text data.

18 Claims, 14 Drawing Sheets

(51) Int. Cl.
*G06F 17/22* (2006.01)
*G06F 17/27* (2006.01)
*H03M 7/40* (2006.01)

(52) U.S. Cl.
CPC ...... *G06F 17/2735* (2013.01); *H03M 7/3084* (2013.01); *H03M 7/40* (2013.01); *H03M 7/4037* (2013.01); *H03M 7/6029* (2013.01)

(58) Field of Classification Search
USPC .............................. 341/51, 65, 67, 106, 107
See application file for complete search history.

(56) References Cited

U.S. PATENT DOCUMENTS

| | | | | |
|---|---|---|---|---|
| 5,945,933 A * | 8/1999 | Kalkstein | ............ | H03M 7/3086 341/106 |
| 6,047,298 A * | 4/2000 | Morishita | ............ | H03M 7/3084 341/106 |
| 6,121,903 A * | 9/2000 | Kalkstein | ............ | H03M 7/3086 341/106 |
| 6,771,824 B1 * | 8/2004 | Chiu | ............ | H03M 7/42 375/E7.144 |
| 6,985,965 B2 | 1/2006 | Hannu et al. | | |
| 7,737,870 B1 * | 6/2010 | Wang | ............ | H03M 7/40 341/50 |
| 8,933,824 B1 * | 1/2015 | Agarwal | ............ | H03M 7/3086 341/50 |
| 9,520,896 B1 * | 12/2016 | Kataoka | ............ | H03M 7/3088 |
| 2005/0012647 A1 * | 1/2005 | Kadono | ............ | H03M 7/4006 341/67 |
| 2005/0122240 A1 * | 6/2005 | Kim | ............ | H03M 7/40 341/65 |
| 2008/0147801 A1 | 6/2008 | Foti | | |
| 2012/0194361 A1 * | 8/2012 | Archbold | ............ | H03M 7/30 341/87 |
| 2013/0135123 A1 * | 5/2013 | Golander | ............ | H03M 7/6076 341/65 |

FOREIGN PATENT DOCUMENTS

| | | |
|---|---|---|
| JP | 8-288861 | 11/1996 |
| JP | 2004-514366 | 5/2004 |
| WO | WO 02/41497 A2 | 5/2002 |

OTHER PUBLICATIONS

"Deflate" Wikipedia, Retrieved from Internet: https://en.wikipedia.org/w/index.php?title=DEFLATE&oldid=684156629 on Feb. 2, 2017, XP055341597, 8 Pages.

"Project Option: Compression with LZW and Huffman Encoding" Retrieved from Internet: https://courses.cs.washington.edu/courses/cse326/00wi/projects/project4compression.html on Sep. 26, 2016, XP055305409, 3 Pages.

"Huffman coding" Wikipedia, Retrieved from Internet: https://en.wikipedia.org/w/index.php?title=Huffman_coding&oldid=679683586 on Feb. 2, 2017, XP055341798, 10 Pages.

* cited by examiner

FIG.9

| STATIC CODE/DYNAMIC CODE | OCCURRENCE FREQUENCY |
|---|---|
| 00000 (STATIC CODE) | OCCURRENCE FREQUENCY a1 |
| 00001 (STATIC CODE) | OCCURRENCE FREQUENCY a2 |
| 00002 (STATIC CODE) | OCCURRENCE FREQUENCY a3 |
| ... ||
| A000h (DYNAMIC CODE) | OCCURRENCE FREQUENCY b1 |
| A001h (DYNAMIC CODE) | OCCURRENCE FREQUENCY b2 |
| ... ||

107

| IDENTIFIER OF LEAF | IDENTIFI-CATION BIT | SPARE DATA | POINTER TO STATIC DICTIONARY/ POINTER TO DYNAMIC DICTIONARY |
|---|---|---|---|

| POINTER TO NODE OF HIGH LEVEL |
|---|
| POINTER TO LOWER LEFT (0) NODE |
| POINTER TO LOWER RIGHT (1) NODE |

NON-TRANSITORY COMPUTER-READABLE RECORDING MEDIUM, ENCODING METHOD, ENCODING DEVICE, DECODING METHOD, AND DECODING DEVICE

CROSS-REFERENCE TO RELATED APPLICATION(S)

This application is based upon and claims the benefit of priority of the prior Japanese Patent Application No. 2015-197944, filed on Oct. 5, 2015, the entire contents of which are incorporated herein by reference.

FIELD

The embodiments discussed herein is related to an encoding program, and the like.

BACKGROUND

In the conventional encoding technology, there has been an encoding technique by using a static dictionary and a dynamic dictionary when encoding text data. For example, the static dictionary is a dictionary that associates a word and a static code having a code length according to the occurrence frequency of the word. The dynamic dictionary is a dictionary that associates a character string that occurs more than once in text data with a dynamic code. In the conventional encoding technique, as for a word for which a hit is found in the static dictionary, it is replaced with a static code in the static dictionary, and as for a character string occurring more than once for which no hit is found in the static dictionary, the character string is registered in the dynamic dictionary, and a dynamic code is assigned to the character string.

In the conventional encoding technique, when decoding encoded data, a dictionary to be referred is different between a static code and a dynamic code. Therefore, in the conventional encoding technique, an identification bit to identify which of the static dictionary and the dynamic dictionary is used to encode data is added at the top of the static code and the dynamic code (Japanese National Publication of International Patent Application No. 2004-514366 and Japanese Laid-open Patent Publication No. 08-288861).

However, in the conventional technique described above, there has been a problem that entropy encoding according to the occurrence frequency of a character string in text data is not performed.

For example, the code length of a static code corresponding to a word that is registered in the static dictionary is one according to the occurrence frequency of the corresponding word. However, if an identification bit is added, the code length becomes different from the one according to the occurrence frequency. Moreover, a dynamic code of the dynamic dictionary has a predetermined code length regardless of the occurrence frequency of a character string corresponding to a dynamic word, and the code length is not the one according to the occurrence frequency of the corresponding character string.

SUMMARY

According to an aspect of an embodiment, a non-transitory computer-readable recording medium stores therein an encoding program that causes a computer to execute a process including: first generating static-encoded data from input text data, utilizing a static dictionary that associates a character strings and static codes, respectively the static-encoded data including a plurality of static codes corresponding to a plurality of character strings that are registered in the static dictionary; second generating dynamic-encoded data from the static-encoded data by encoding a character string or the static code that occurs more than once in the static-encodes data into a dynamic code; first creating a dynamic dictionary associating character strings or static codes with corresponding dynamic codes, respectively; and second creating a Huffman tree and data of a leaf in the Huffman tree based on an occurrence frequency of the dynamic codes and the static codes in the input text data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 depicts one example of a data structure of occurrence-frequency table data;

DESCRIPTION OF EMBODIMENT(S)

Preferred embodiments of the present invention will be explained with reference to accompanying drawings. The present invention is not limited to this embodiment.

Figure 1:
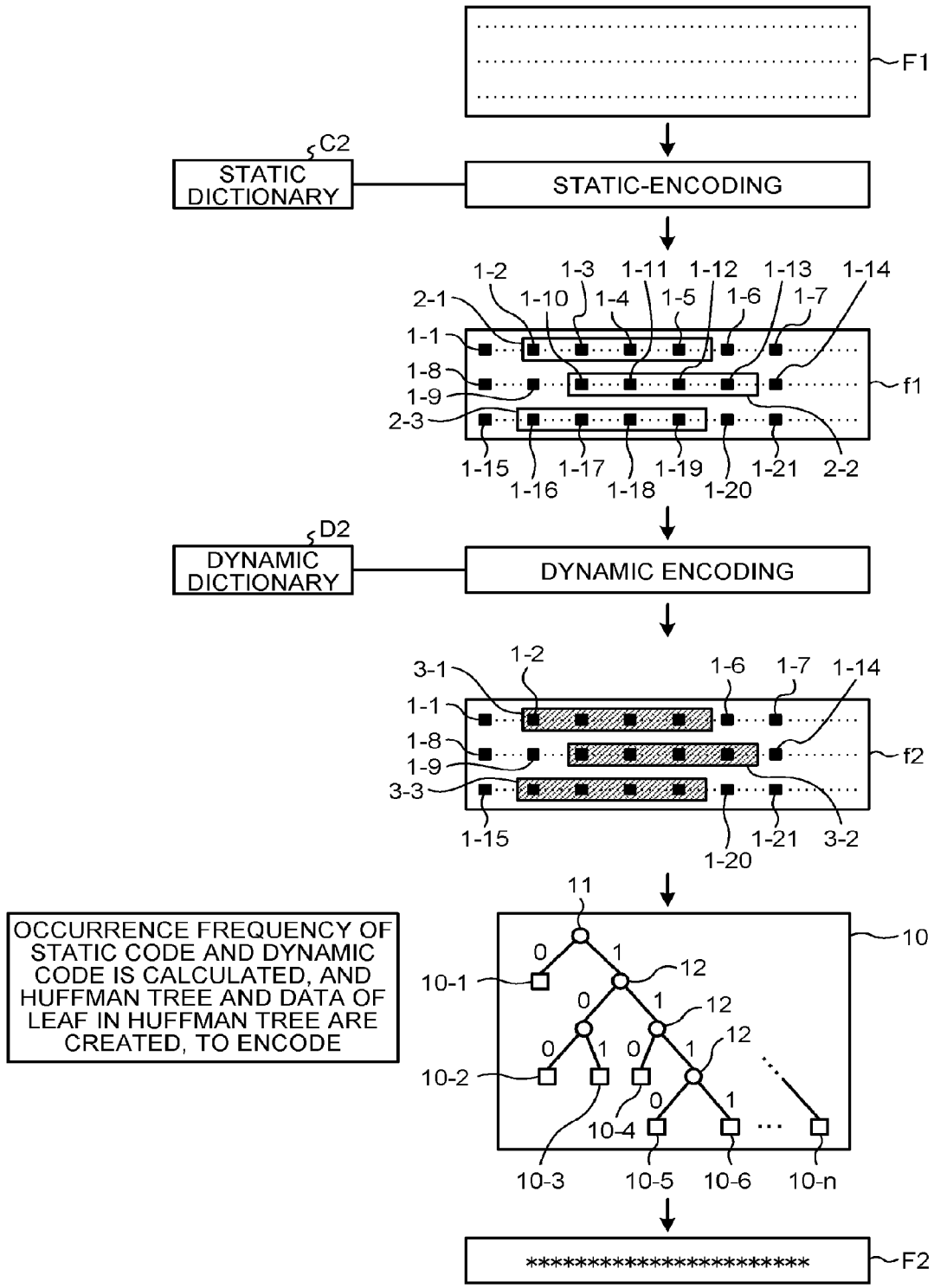
FIG. 1 depicts one example of a flow of encoding processing of an information processing device according to a present embodiment.

FIG. 1 depicts one example of a flow of encoding processing of an information processing device according to the present embodiment. The information processing device is one example of an encoding device. The information processing device reads a file F1 to be subjected to encoding, and performs static encoding using a static dictionary C2. The static dictionary C2 is a dictionary that associates a word and a static code having a code length according to the occurrence frequency of the word. The information processing device compares words in the file F1 with words in the static dictionary C2, and replaces a word for which a hit is found in the static dictionary C2 with a static code, thereby converting the file F1 into static-encoded data f1. For example, in the static-encoded data f1, static codes 1-1 to 1-21 are included.

Subsequently, the information processing device subjects dynamic encoding to the static-encoded data f1. For example, the information processing device encodes a character string or static code that occurs more than once into a dynamic code, thereby converting the static-encoded data f1 into a dynamic-encoded data f2. For example, when the same character string or static code occurs repeatedly in character regions 2-1, 2-2, and 2-3 of the static-encoded data f1, by converting the character regions 2-1, 2-2, and 2-3 into dynamic codes, the dynamic-encoded file f2 is created.

For example, the information processing device registers a character string or static code included in the character region 2-1 in a dynamic dictionary D2, and assigns a registration number to the registered character string or static code. The registration number is to be a dynamic code to be assigned to the character regions 2-1 to 2-3.

Subsequently, the information processing device calculates the occurrence frequency of the static codes and the dynamic codes included in the dynamic-encoded data f2, and creates an occurrence frequency table. The information processing device creates a Huffman tree 10 based on the occurrence frequency table. For example, the Huffman tree 10 has a root node 11 at a topmost level, respective nodes 12 connected by branches, and leaves 10-1 to 10-$n$ at respective lowermost levels. For example, the respective leaves 10-1 to 10-$n$ are leaves corresponding to the static codes or the dynamic codes.

For example, the information processing device sorts leaves corresponding to the static codes and the dynamic codes by occurrence frequency of the static codes and the dynamic codes to build branches of a binary tree, thereby creating the Huffman tree 10. A leaf corresponding to a static code stores a pointer that indicates a position of the word corresponding to the static code present in the static dictionary C2. A leaf corresponding to a dynamic code stores a pointer that indicates a position of the character string or static code corresponding to the dynamic code in the dynamic dictionary D2.

The information processing device compares the Huffman tree 10 and the dynamic-encoded data f2, and encodes the static codes and the dynamic codes included in the dynamic-encoded data f2 by the Huffman tree 10, thereby creating an encoded file F2. For example, when a leaf of the Huffman tree 10 corresponding to the static code 1-1 is a leaf 10-4, the information processing device encodes the static code 1-1 into "110" based on the Huffman tree 10. For example, when the same dynamic code is assigned to the dynamic codes 3-1 to 3-3, and a leaf corresponding to the dynamic code is a leaf 10-3, the information processing device encodes the dynamic codes 3-1 to 3-3 into "101" based on the Huffman tree 10.

The respective leaves 10-1 to 10-$n$ are arranged in order of occurrence frequency of a static code or a dynamic code corresponding to the leaf, and a short code is assigned to a word with a high occurrence frequency. Moreover, the information processing device does not add, when encoding the static code and the dynamic code, an identification bit that indicates which of the static dictionary and the dynamic dictionary is used for encoding. Therefore, according to the information processing device, a redundant identification bit can be removed, and encoding according to the occurrence frequency of a static code and a dynamic code can be performed.

Figure 2:
FIG. 2 depicts a block configuration example of an encoded file F2.

FIG. 2 depicts a block configuration example of the encoded file F2. As depicted in FIG. 2, the coded file F2 includes a header portion, encoded data, and a trailer portion. The header portion has, for example, information to identify an algorithm that has been used to create the encoded file F'", the occurrence frequency table of static codes and dynamic codes, and the like. The encoded data corresponds to each encoded data created by the information processing device. The trailer portion includes information of the dynamic dictionary D2 that has been used to perform the dynamic encoding, and the like.

Figure 3:
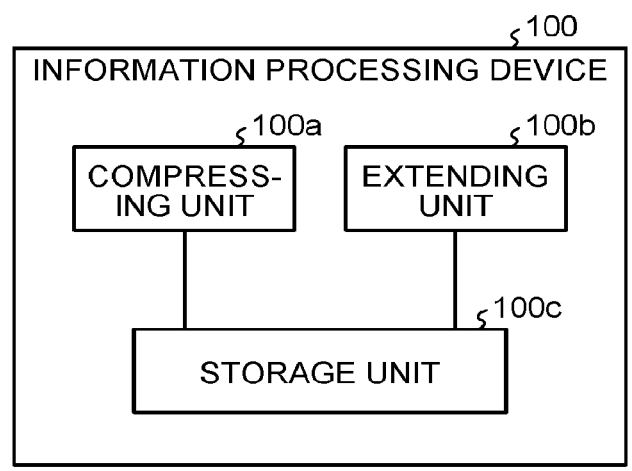
FIG. 3 is a functional block diagram depicting a configuration of the information processing device according to the present embodiment.

FIG. 3 is a functional block diagram depicting a configuration of the information processing device according to the present embodiment. As depicted in FIG. 3, this information processing device 100 includes a compressing unit 100$a$, an extending unit 100$b$, and a storage unit 100$c$.

The compressing unit 100$a$ is a processing unit that performs the encoding processing depicted in FIG. 1. The extending unit 100$b$ is a processing unit that extends encoded data that has been encoded by the compressing unit 100$a$. The storage unit 100$c$ stores the file F1 to be subjected to encoding, the encoded file F2 that is obtained by the encoding processing, an extension file F3 that is obtained by extending the encoded file F2, and the like.

Figure 4:
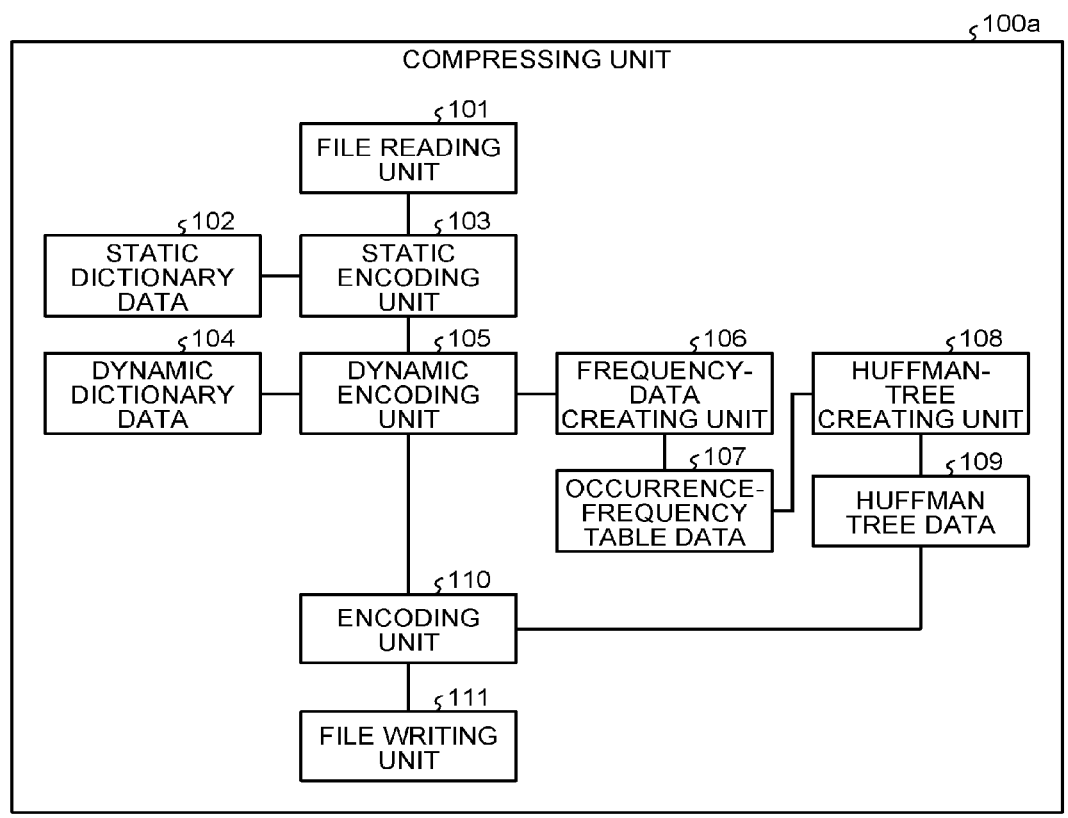
FIG. 4 is a functional block diagram depicting one example of a configuration of a compressing unit according to the present embodiment.

FIG. 4 is a functional block diagram depicting one example of a configuration of the compressing unit according to the present embodiment. As depicted in FIG. 4, this compressing unit 100$a$ includes a file reading unit 101, static dictionary data 102, a static encoding unit 103, dynamic dictionary data 104, and a dynamic encoding unit 105. Moreover, the compressing unit 100$a$ includes a frequency-data creating unit 106, occurrence-frequency table data 107, a Huffman-tree creating unit 108, Huffman tree data 109, an encoding unit 110, and a file writing unit 111.

The file reading unit 101 is a processing unit that reads data in a content part in the file F1 to be subjected to encoding. The file reading unit 101 outputs the read data to the static encoding unit 103.

Figure 5:
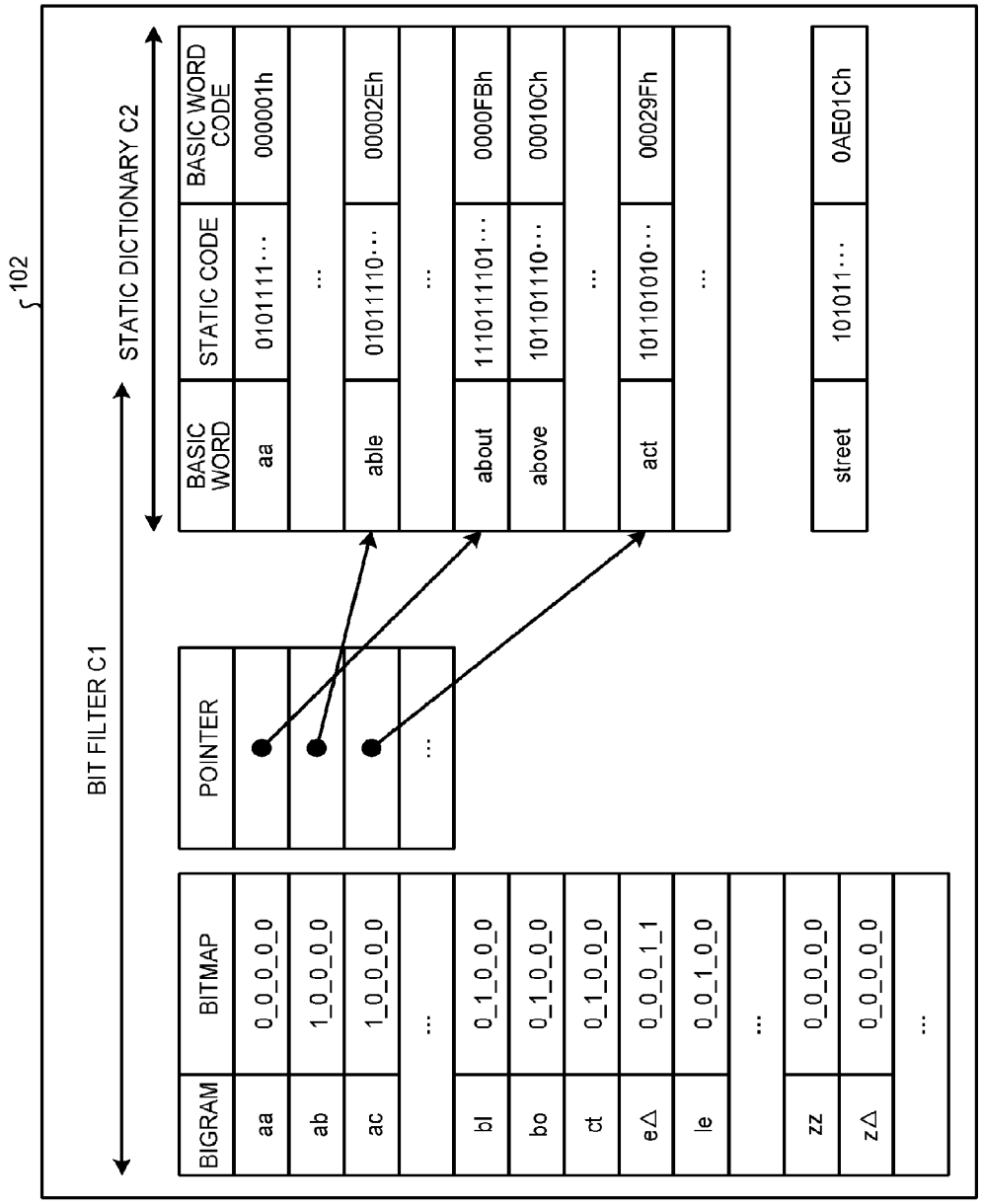
FIG. 5 depicts one example of a data structure of static dictionary data.

FIG. 5 depicts one example of a data structure of static dictionary data. The static dictionary data 102 includes data of the static dictionary C2 in which a static code corresponding to a word having the occurrence frequency equal to or higher than a threshold is defined. As depicted in FIG. 5, this static dictionary data 102 has bigram, bitmap, pointer, basic word, static code, and basic word code. Out of these, bigram, bitmap, pointer, and basic word correspond to a bit filter C1. Furthermore, basic word, static code, and basic word code correspond to the static dictionary C2.

Bigram is information indicating a character string (or word) with two characters is indicated. Bitmap indicates a bitmap corresponding to the character string of gram. For example, the bitmap corresponding to "aa" is "0_0_0_0_0". The pointer is a pointer that indicates a position of a basic word corresponding to bitmap.

The basic word is, for example, a word having high frequency registered in the static dictionary C2. The static code is encoded data assigned to a basic word. Note that the static dictionary C2 may include data on a character string length, occurrence frequency, and the like in addition to the basic word and the static code.

The static encoding unit 103 is a processing unit that compares content data included in the file F1 of the file reading unit 101 and the bit filter C1 of the static dictionary data 102, and replaces a word that hits the bit filter C1 with a static code. The static encoding unit 103 generates the static-encoded data f1 in which the content data included in the file F1 with static codes, to output to the dynamic encoding unit 105.

One example of processing of the static encoding unit 103 that determines whether a word hits the bit filter nC1 is explained. For example, the static encoding unit 103 combines, when a word is "talk", bitmaps corresponding to "ta", "al", and "lk" of bigram. The static encoding unit 103 sets a corresponding digit of the combined bitmap to "0" when all bitmap values are "0" in each digit of bitmap. On the other hand, when even a single "1" is included, the static encoding unit 103 sets a corresponding digit to "1", thereby combining bitmaps.

For example, suppose a bitmap of "ta" is "0_0_0_0_0", a bitmap of "al" is "0_1_0_0_0", and a bitmap of "lk" is "0_0_1_0_0". In this case, a bitmap obtained by combining the respective bitmaps is "0_1_1_0_0".

The static encoding unit 103 compares the combined bitmap with a pointer of the bit filter C1, and identifies a basic word at a position indicated by the pointer corresponding to the bitmap. The static encoding unit 103 searches a basic word corresponding to a word sequentially from the identified basic word. The static encoding unit 103 determines that a word hits the bit filter C1 when a base word same as the word is present.

Figure 6:
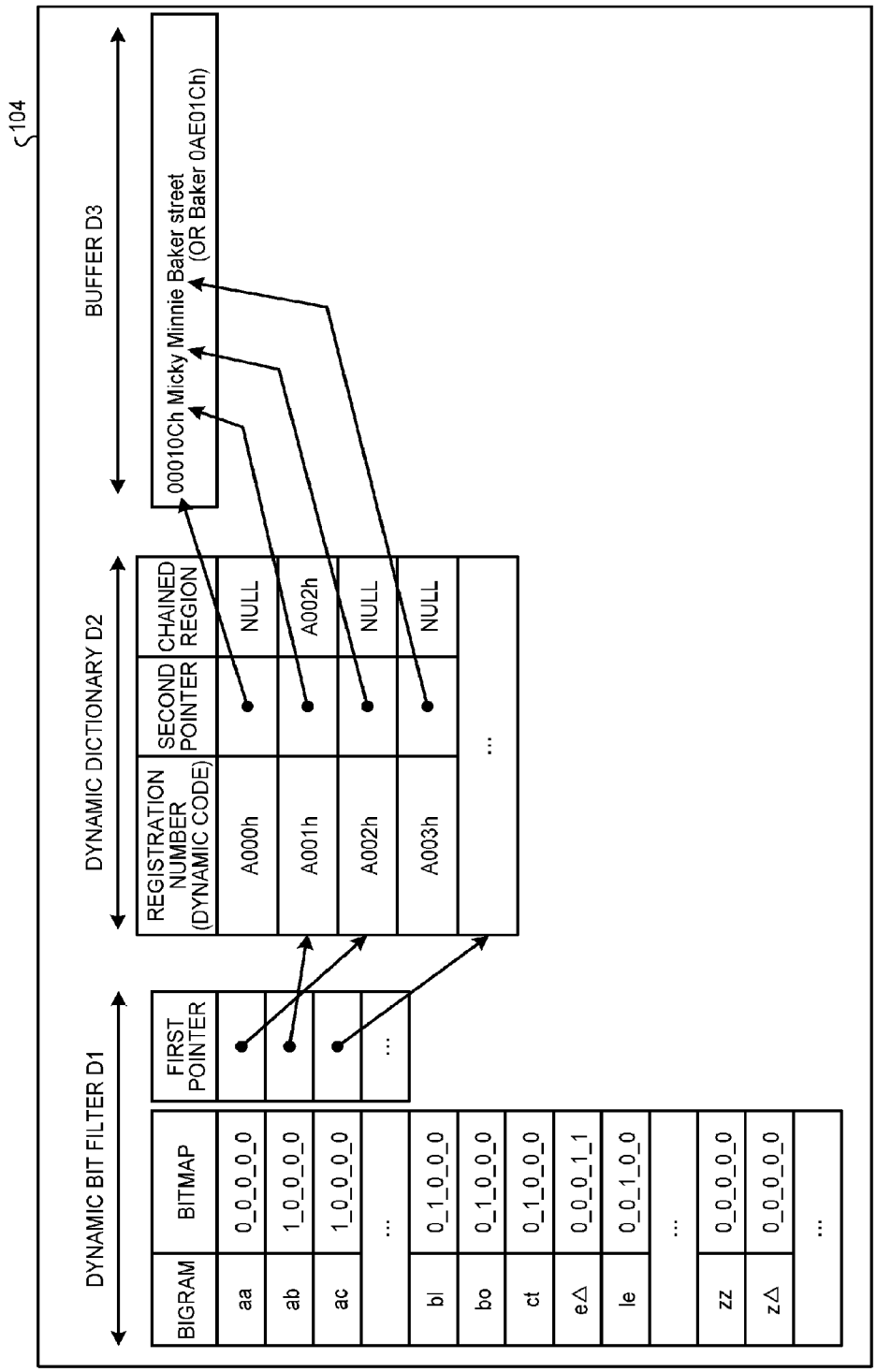
FIG. 6 depicts one example of a data structure of dynamic dictionary data.

FIG. 6 depicts one example of a data structure of the dynamic dictionary data. The dynamic dictionary data 104 includes data relating to the dynamic dictionary described above. As depicted in FIG. 6, the dynamic dictionary data 104 has a dynamic bit filter D1, the dynamic dictionary D2, and a buffer D3. The dynamic bit filter D1 has bigram, bitmap, and a first pointer. The dynamic dictionary D2 associates a registration number (dynamic code), a second pointer, and a chained region with each other. The buffer D3 stores a character string prior to encoding by dynamic codes, and a static code.

Bigram in the dynamic bit filter D1 is data indicating a character string of two characters (or a word, a number corresponding to a static code). Bitmap indicates a bitmap corresponding to a bigram character string. For example, a bitmap corresponding to "aa" is "0_0_0_0_0". The first pointer is a pointer that indicates a position of a registration number (dynamic code) corresponding to a bitmap.

The registration number (dynamic code) of the dynamic dictionary D2 is a code assigned to a character string stored in the buffer D3. The second pointer is data indicating a position of the buffer D3 storing the character string corresponding to the registration number. For example, the second pointer corresponding to a registration number "A001h" indicates a starting position of "Micky" stored in the buffer D3. That is, the character string "Micky" is dynamic-encoded into a dynamic code "A001h". For example, the second pointer corresponding to a registration number "A003h" indicates a starting position of "Baker street" stored in the buffer D3. Out of this, for example, "street (0AE01Ch)" is a static code. That is, "Baker street" or "Baker 0AE01Ch" including a character string and a static code is dynamic-encoded into the dynamic code "A003h".

The chained region of the dynamic dictionary D2 is data indicating whether a corresponding character string or the like is chained from a pointer of the bit filter. For example, as "A002h" is registered in the chained region of the registration number "A001h", it is indicated that "Micky" corresponding to the registration number "A001h" and "Minne" corresponding to the registration number "A002h" are chained. Note that when a corresponding character string or the like is not chained, "NULL" is set to the chained region.

The dynamic encoding unit 105 is a processing unit that generates the dynamic-encoded data f2 by subjecting the static-encoded data f1 to encoding of a character string or static code that occurs more than once into a dynamic code. The dynamic encoding unit 105 outputs the dynamic-encoded data f2 to the frequency-data creating unit 106 and the encoding unit 110.

Figure 7:
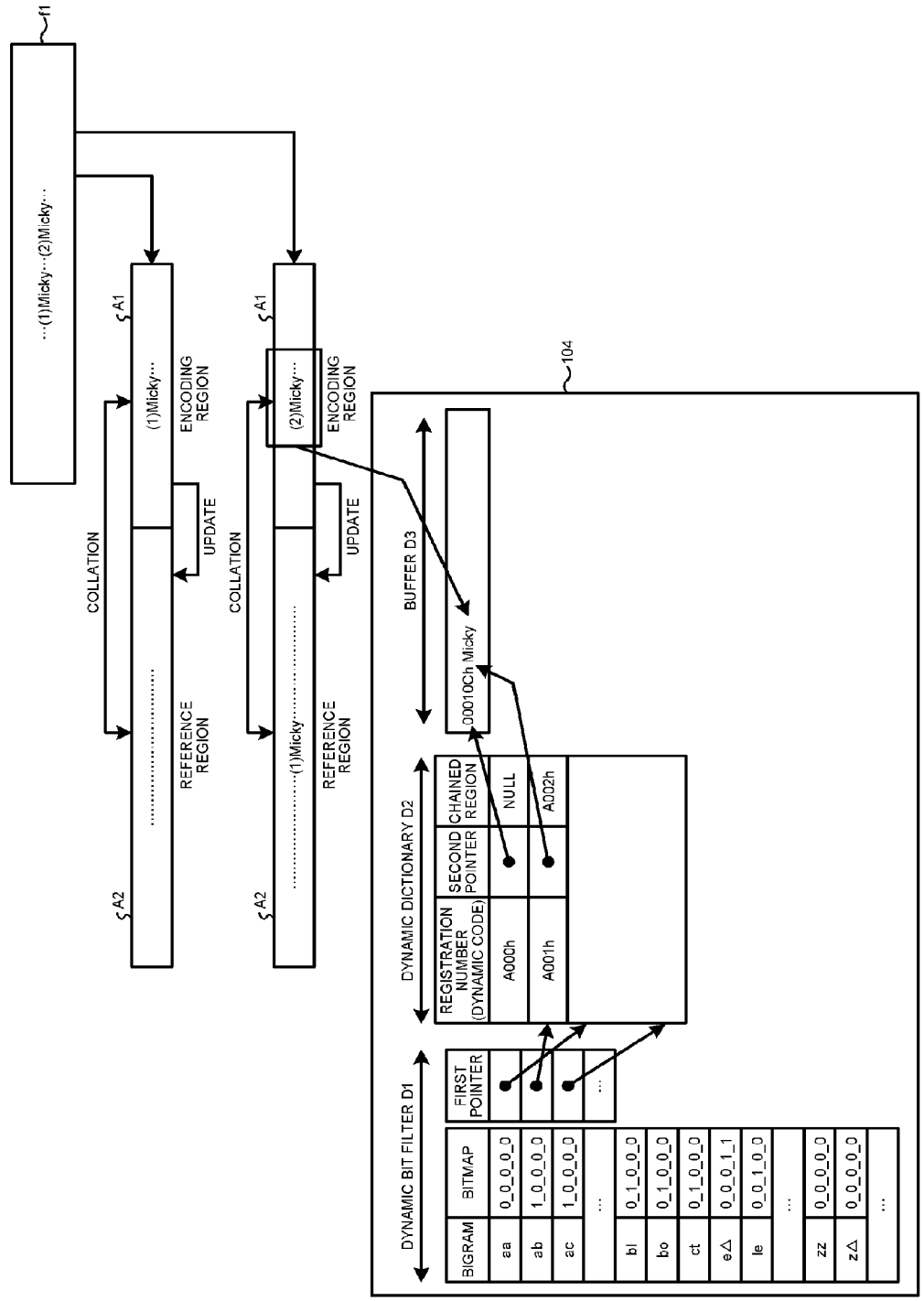
FIG. 7 is a diagram (1) depicting one example of processing to identify a character string or static code that occurs more than once performed by a dynamic encoding unit.
Figure 8:
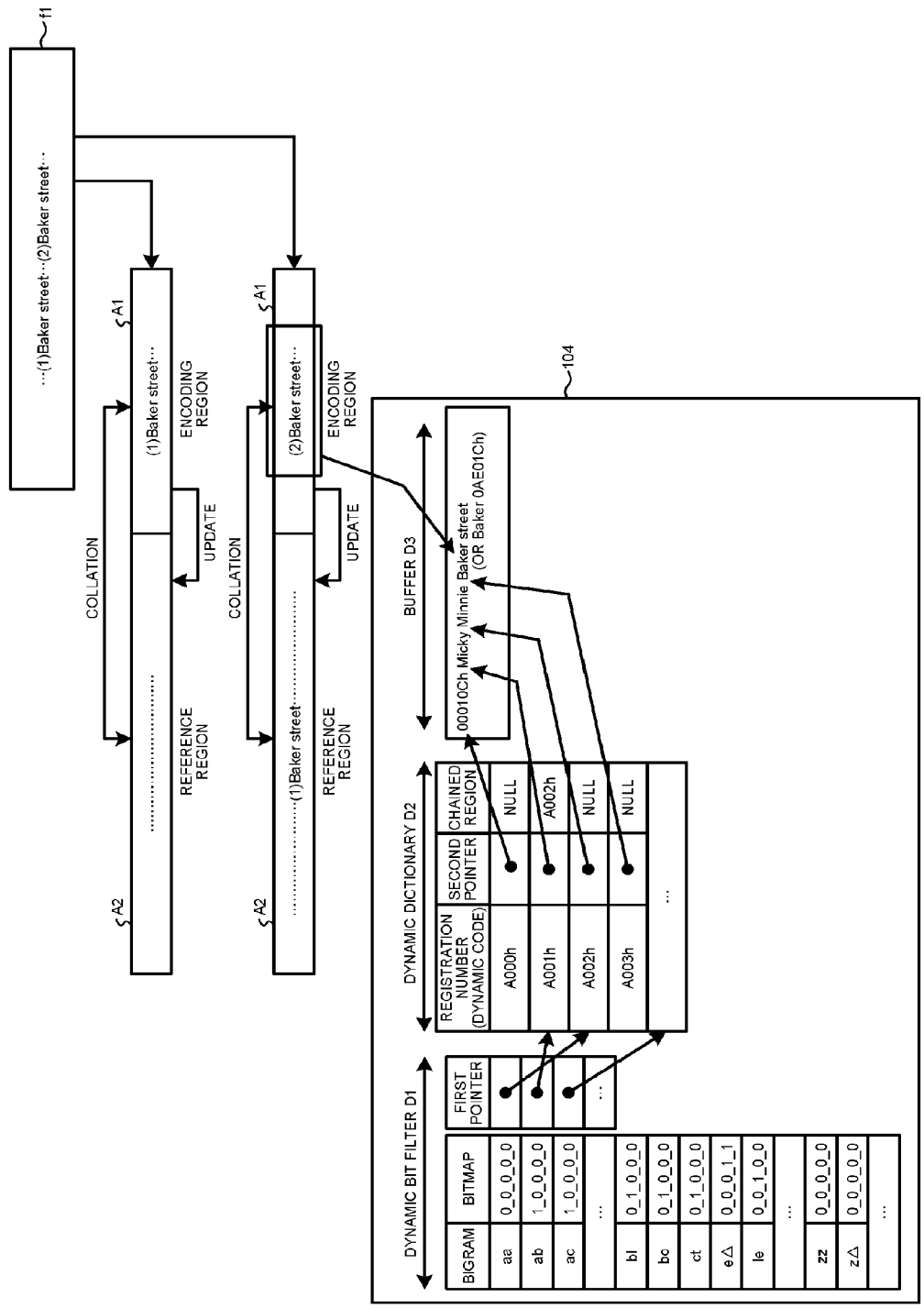
FIG. 8 is a diagram (2) depicting one example of processing to identify a character string or static code that occurs more than once performed by the dynamic encoding unit.

FIG. 7 and FIG. 8 are diagrams depicting one example of processing to identify a character string that occurs more than once or a static code performed by the dynamic encoding unit. The dynamic encoding unit 105 reads a character string from the static-encoded data f1, stores it in an encoding region A1, and collates the encoding region A1 and a reference region A to determine whether an identical character string or static code is present therein. When it is determined that an identical character string or static code is present as a result of collation, the dynamic encoding unit 105 identifies the character string or static code as a character string or static code that occurs more than once. The dynamic encoding unit 105 makes an update of adding the character string stored in the encoding region A1 into the reference region A2 after collation, and reads a character string having a predetermined length from the static-encoded data f1, to store in the encoding region A1.

FIG. 7 is explained. In the example depicted in FIG. 7, the static-encoded data f1 is "(1) Micky . . . (2) Micky . . . ". (1) and (2) in the static-encoded data f1 are added expediently to distinguish each character string "Micky", and are not included in the static-encoded data f1 in an actual state. Moreover, " . . . " in the static-encoded data f1 corresponds to an unspecific character string or static code.

The dynamic encoding unit 105 reads the character string "(1) Micky . . . " having a predetermined length from the static-encoded data f1 to store in the encoding region A1. The dynamic encoding unit 105 compares the character string stored in the encoding region A1 with character strings stored in the reference region A2, and determines whether an identical character string (or static character string) is present. In this case, an identical character string is not present, the dynamic encoding unit 105 stores, in the reference region A2, "(1) Micky . . . " that has been stored in the encoding region A1, to update the reference region A2.

The dynamic encoding unit 105 reads the character string "(2) Micky . . . " having a predetermined length from the static-encoded data f1 to store in the encoding region A1. The dynamic encoding unit 105 compares the character string stored in the encoding region A1 with character strings stored in the reference region A2, and determines whether an identical character string (or static character string) is present. In this case, an identical character string "Micky" is present, and therefore, the dynamic encoding unit 105 determines that "Micky" is a character string that occurs more than once. The dynamic encoding unit 105 stores, in the reference region A2, "(2) Micky . . ." that has been stored in the encoding region A1, to update the reference region A2.

The dynamic encoding unit 105 stores "Micky" that occurs more than once in the buffer D3 of the dynamic dictionary data 104, sets the registration number "A001h" in the dynamic dictionary D2, and sets the position indicated by the second pointer that corresponds to the registration number "A001h" to a starting position of "Micky" in the buffer D3. Moreover, the dynamic encoding unit 105 encodes "Micky" into "A001h".

FIG. 8 is explained. In the example depicted in FIG. 8, the static-encoded data f1 is "(1) Baker street . . . (2) Baker street . . . ". (1) and (2) in the static-encoded data f1 are added expediently to distinguish each character string "Baker street", and are not included in the static-encoded data f1 in an actual state. Moreover, " . . . " in the static-encoded data f1 corresponds to an unspecific character string or static code. Furthermore, out of "Baker street", "street" is a static code.

The dynamic encoding unit 105 reads the character string "(1) Baker street . . . " having a predetermined length from the static-encoded data f1 to store in the encoding region A1. The dynamic encoding unit 105 compares the character string stored in the encoding region A1 with character strings stored in the reference region A2, and determines whether an identical character string (or static character string) is present. In this case, an identical character string is not present, and therefore, the dynamic encoding unit 105 stores, in the reference region A2, "(1) Baker street . . . " that has been stored in the encoding region A1, to update the reference region A2.

The dynamic encoding unit 105 reads "(2) Baker street . . . " having a predetermined length from the static-encoded data f1 to store in the encoding region A1. The dynamic encoding unit 105 compares the character string stored in the encoding region A1 with character strings stored in the reference region A2, and determines whether an identical character string (or static character string) is present. In this case, an identical character string and a static code "Baker street . . . " is present, and therefore, the dynamic encoding unit 105 determines that "Baker street . . . " is a character string that occurs more than once. The dynamic encoding unit 105 stores, in the reference region A2, "(2) Baker street . . . " that has been stored in the encoding region A1, to update the reference region A2.

The dynamic encoding unit 105 stores "Baker street" or "Baker 0AE01Ch" that occurs more than once in the buffer D3 of the dynamic dictionary data 104, sets the registration number "A003h" in the dynamic dictionary D2, and sets the position indicated by the second pointer that corresponds to the registration number "A003h" to a starting position of "Baker street". Moreover, the dynamic encoding unit 105 encodes "Baker street" into "A003h".

The dynamic encoding unit 105 generates the dynamic-encoded data f2 by subjecting the static-encoded data f1 to encoding of a character string or static code that occurs more than once into a dynamic code.

The frequency-data creating unit 106 is a processing unit that creates the occurrence-frequency table data 107 by counting the occurrence frequency of a static code and a dynamic code included in the dynamic-encoded file f2. FIG. 9 depicts one example of a data structure of the occurrence-frequency table data. As depicted in FIG. 9, this occurrence-frequency table data 107 associates a static code or dynamic code with an occurrence frequency.

The Huffman-tree creating unit 108 is a processing unit that creates the Huffman tree data 109 based on the occurrence-frequency table data 107. For example, the Huffman-tree creating unit 108 creates a leaf having information of a static code and a leaf having information of a dynamic code. The Huffman-tree creating unit 108 sorts created leaves in order of occurrence frequency of a static code and a dynamic code, and built branches of a binary tree, thereby creating the Huffman tree data 109.

Figure 10:
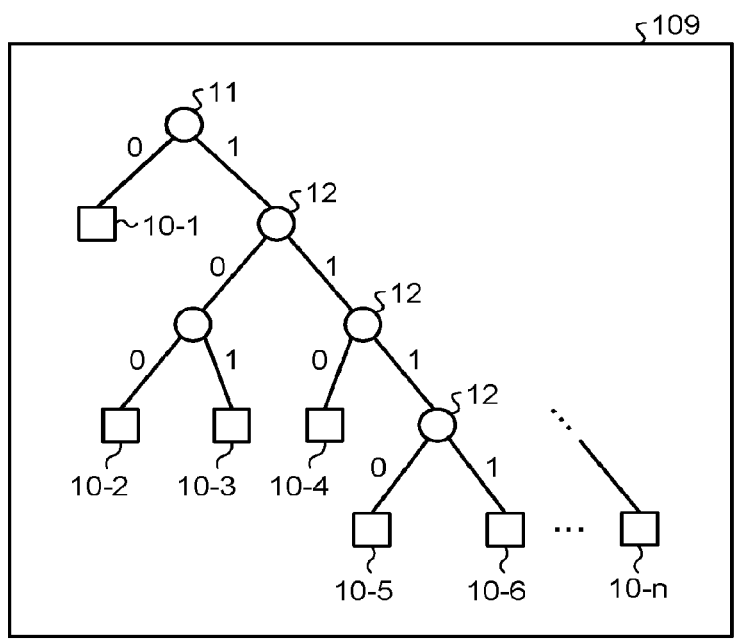
FIG. 10 depicts one example of a data structure of Huffman tree data.

FIG. 10 depicts one example of a data structure of the Huffman tree data. For example, the Huffman tree data 109 has the root node 11 at a topmost level, the respective nodes 12 connected by branches, and the leaves 10-1 to 10-$n$ at respective lowermost levels. A structure with a root and leaves is constituted of a pointer to a high level node (or root), a pointer or leaf to a lower left node (0), and a pointer or leaf to a lower right (1) node. For example, the respective leaves 10-1 to 10-$n$ are leaves corresponding to the static codes or the dynamic codes. Details of each leaf are, as depicted in 10$a$, an identifier of a leaf, an identification bit of a static dictionary or dynamic dictionary, spare data, and a pointer to a static dictionary or to a dynamic dictionary. For example, when a leaf corresponds to a static code, an identifier of the leaf, the identification bit (0) of the static dictionary, spare data, and a pointer to the static dictionary are stored. For example, the pointer to the static dictionary is a pointer indicating a position of a basic word of the static dictionary C2 corresponding to the static code.

When a leaf corresponds to the dynamic code, the identifier of the leaf, the identification bit of the static dictionary (1), spare data, and a pointer to the dynamic dictionary are stored. For example, the pointer to the dynamic dictionary is a pointer indicating a position of a character string or static code on the buffer D3 corresponding to the dynamic code. The identification bit of a leaf in the Huffman tree enables to remove an identification bit stored conventionally in encoded data to distinguish the static dictionary or the dynamic dictionary, and the compressibility by the entropy encoding can be improved. Moreover, by utilizing a pointer to the static dictionary or dynamic dictionary, omission of the identification bit is also possible.

The encoding unit 110 is a processing unit that compares the dynamic-encoded data f2 with the Huffman tree data 109, and encodes a static code or a dynamic code included in the dynamic-encoded data f2 based on the Huffman tree, thereby creating encoded data. The encoding unit 110 outputs the encoded data to the file writing unit 111.

For example, when a leaf of the Huffman tree 10 corresponding to one static code is the leaf 10-4 in FIG. 10, the encoding unit 110 encodes the static code into "110" based on the Huffman tree 10. When a leaf of the Huffman tree 10 corresponding to one dynamic code is the leaf 10-3 in FIG. 10, the encoding unit 110 encodes the dynamic code into "101" based on the Huffman tree 10.

The file writing unit 111 is a processing unit that acquires encoded data from the encoding unit 110, and that writes the acquired encoded data into the encoded file F2. Furthermore, the file writing unit 111 stores data to identify an algorithm that has been used to create the encoded file F2, or the occurrence-frequency table data of a static code and a dynamic code. The file writing unit 111 stores data of the static dictionary C2 and the dynamic dictionary D2 in the trailer portion.

Figure 11:
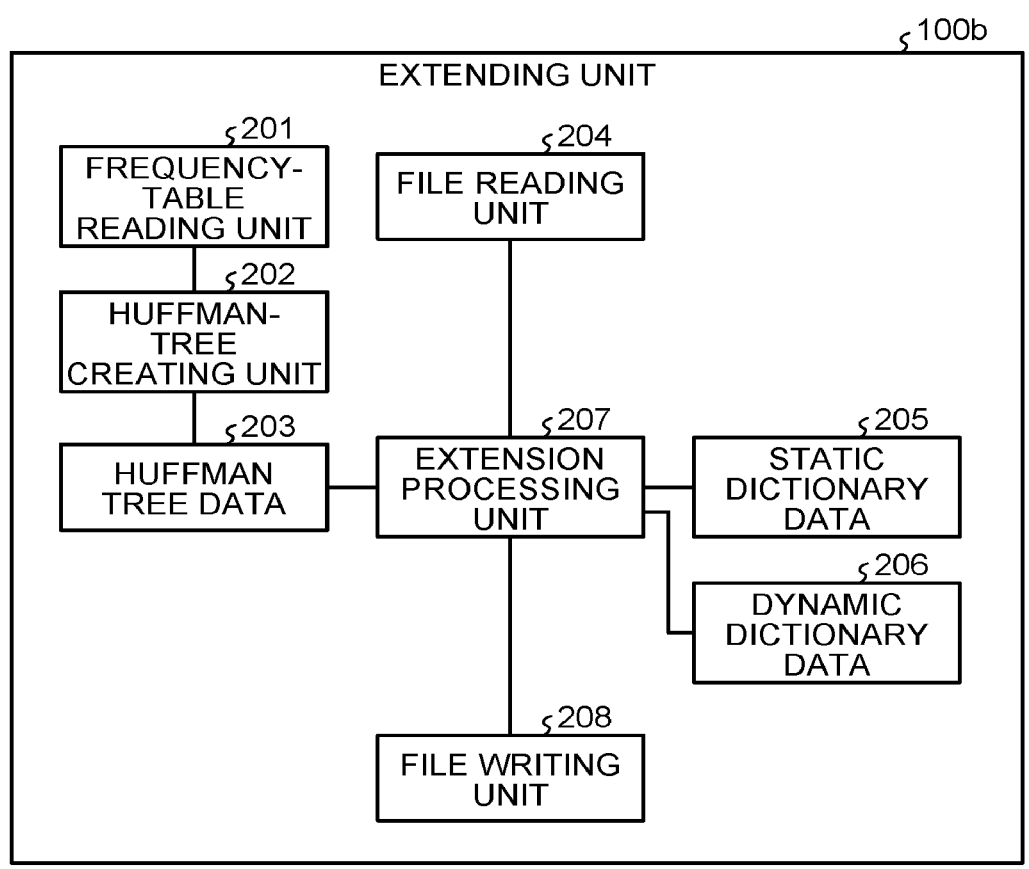
FIG. 11 is a functional block diagram depicting one example of a configuration of an extending unit according to the present embodiment.

FIG. 11 is a functional block diagram depicting one example of a configuration of the extending unit according to the present embodiment. As depicted in FIG. 11, the extending unit 100$b$ includes a frequency-table reading unit 201, a Huffman-tree creating unit 202, and Huffman tree data 203. Moreover, the extending unit 100b includes a file reading unit 204, static dictionary data 205, dynamic dictionary data 206, an extension processing unit 207, and a file writing unit 208.

The frequency-table reading unit 201 is a processing unit that reads occurrence-frequency table data of a static code and a dynamic code stored in the header portion of the encoded file F2, to output to the Huffman-tree creating unit 202. For example, the occurrence-frequency table data read by the frequency-table reading unit 201 corresponds to the occurrence-frequency table data 107 in FIG. 4.

The Huffman-tree creating unit 202 is a processing unit that creates the Huffman tree data 203 based on the occurrence-frequency table data. Processing of creating a Huffman tree by the Huffman-tree creating unit 202 is similar to the processing of the Huffman-tree creating unit 108 in FIG. 4. Moreover, the data structure of the Huffman tree data 203 is similar to that of the Huffman tree data 109 depicted in FIG. 10.

The Huffman tree data 203 has the root node 11 at a topmost level, the respective nodes 12 connected by branches, and the leaves 10-1 to 10-n at respective lowermost levels similarly to the Huffman tree data 109. For example, the respective leaves 10-1 to 10-n are leaves corresponding to the static codes or the dynamic codes. For example, when a leaf corresponds to a static code, an identifier of the leaf, spare data, and a pointer to the static dictionary are stored. For example, the pointer to the static dictionary is a pointer indicating a position of a basic word corresponding to the static code in the static dictionary data 205.

When a leaf corresponds to the dynamic code, the identifier of the leaf, spare data, and a pointer to the dynamic dictionary are stored. For example, the pointer to the dynamic dictionary is a pointer indicating a position of a character string or static code on the buffer D3 of the dynamic dictionary data 206 corresponding to the dynamic code. The Huffman-tree creating unit 202 may store, when a static code is included in a character string that has been replaced with the dynamic code, data indicating a position of a basic word corresponding to the static code in the leaf corresponding to the dynamic code.

The file reading unit 204 is a processing unit that reads encoded data of the encoded file F2. The file reading unit 204 outputs the encoded data to the extension processing unit 207. Furthermore, the file reading unit 204 reads data of the static dictionary C2 stored in the trailer portion of the encoded file, and stores it in a not illustrated storage region as the static dictionary data 205. The file reading unit 204 reads data of the dynamic dictionary D2 and the like stored in the trailer portion of the encoded file F2, and stores it in a not illustrated storage region as the dynamic dictionary data 206.

The static dictionary data 205 is data in which a basic word and a static code are associated. For example, a data structure of the static dictionary data 205 corresponds to the data structure of the static dictionary C2 depicted in FIG. 5.

The dynamic dictionary data 206 is data in which a dynamic code and a character string or a static code are associated. For example, a data structure of the dynamic dictionary data 206 corresponds to the data structure of the dynamic dictionary D2 and the buffer D3 depicted in FIG. 6.

The extension processing unit 207 compares encoded data acquired from the file reading unit 204 with the Huffman tree data 203, and identifies extension data corresponding to the encoded data based on a leaf reached by following the Huffman tree data 203. For example, when a reached leaf corresponds to a static code, the extension processing unit 207 identifies a basic word indicated by the pointer to the static dictionary data 205 as the extension data.

When a reached leaf corresponds to a dynamic code, the extension processing unit 207 identifies a character string or a static code of the buffer D3 indicated by the pointer to the dynamic dictionary data 206, and further identifies a basic word corresponding to the static code, thereby identifying the extension data. For example, the position of the basic word corresponding to the static code is indicated by a pointer in a leaf corresponding to a dynamic code.

The extension processing unit 207 sequentially identifies extension data by repeatedly performing the above processing on encoded data, and outputs the identified extension data to the file writing unit 208.

The file writing unit 208 is a processing unit that stores the extension data acquired from the extension processing unit 207 in an extension file F3.

Figure 12:
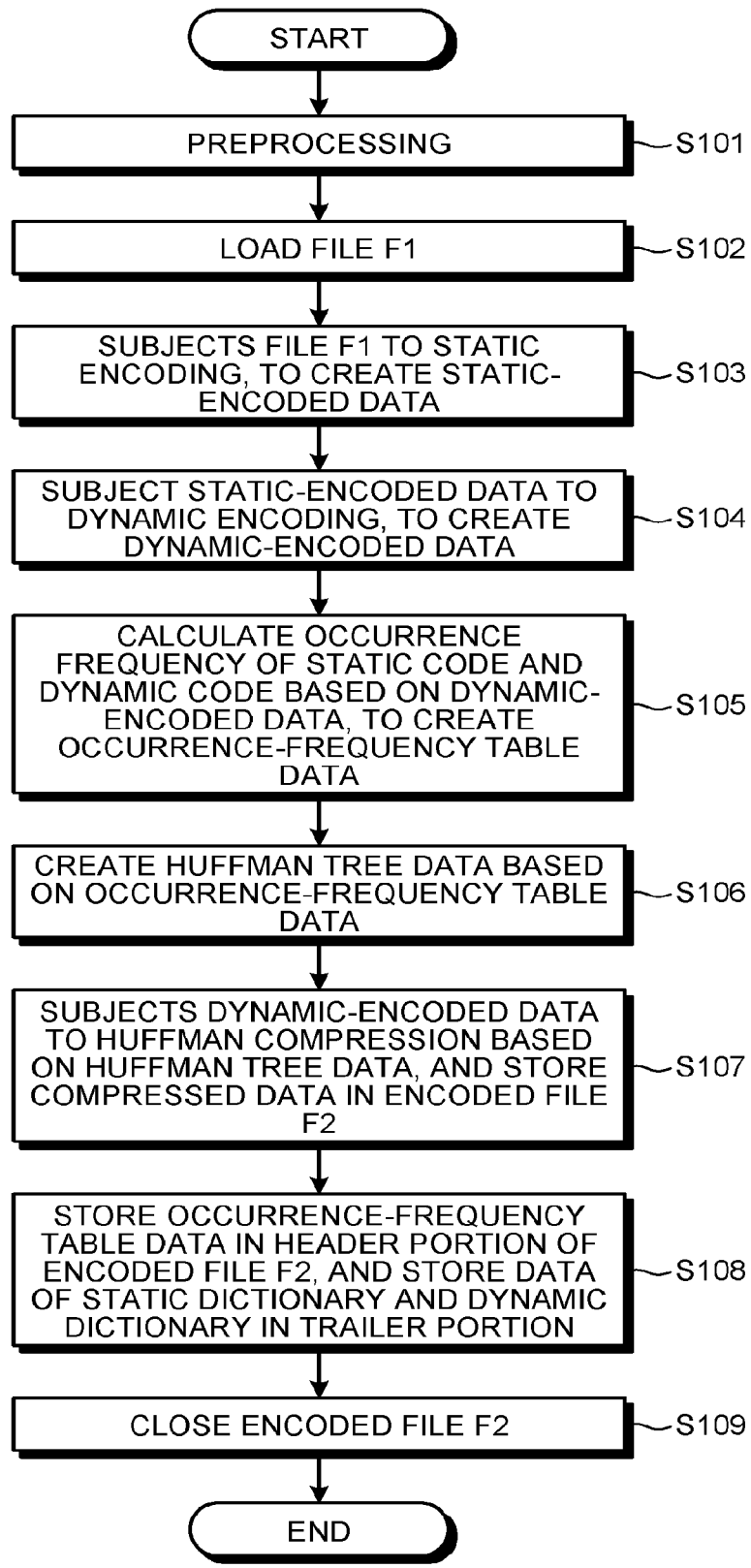
FIG. 12 is a flowchart depicting one example of a processing procedure of the compressing unit according to the present embodiment.

Next, a processing procedure of the compressing unit 100a according to the present embodiment is explained. FIG. 12 is a flowchart depicting one example of a processing procedure of the compressing unit according to the present embodiment. As depicted in FIG. 12, the compressing unit 100a performs preprocessing (step S101). In the preprocessing at step S101, the compressing unit 100a reserves a storage region in the storage unit 100c.

The file reading unit 101 of the compressing unit 100a loads the file F1 (step S102). The static encoding unit 103 of the compressing unit 100a subjects the file F1 to static encoding, to create the static-encoded data f1 (step S103).

The dynamic encoding unit 105 of the compressing unit 100a subjects the static-encoded data f1 to dynamic encoding, to create the dynamic-encoded data f2 (step S104). The frequency-data creating unit 106 of the compressing unit 100a calculates the occurrence frequency of a static code and a dynamic code based on the dynamic-encoded data f2, and generates the occurrence-frequency table data 107 (step S105).

The Huffman-tree creating unit 108 of the compressing unit 100a creates the Huffman tree data 109 based on the occurrence-frequency table data 107 (step S106). The encoding unit 110 of the compressing unit 100a subjects the dynamic-encoded data to Huffman compression based on the Huffman tree data, and the file writing unit 111 stores the compressed data in the encoded file F2 (step S107).

The file writing unit 111 stores the occurrence-frequency table data in the header portion of the encoded file F2, and stores data of the static dictionary C2 and the dynamic dictionary D2 in the trailer portion (step S108). The file writing unit 111 closes the encoded file F2 (step S109).

Figure 13:
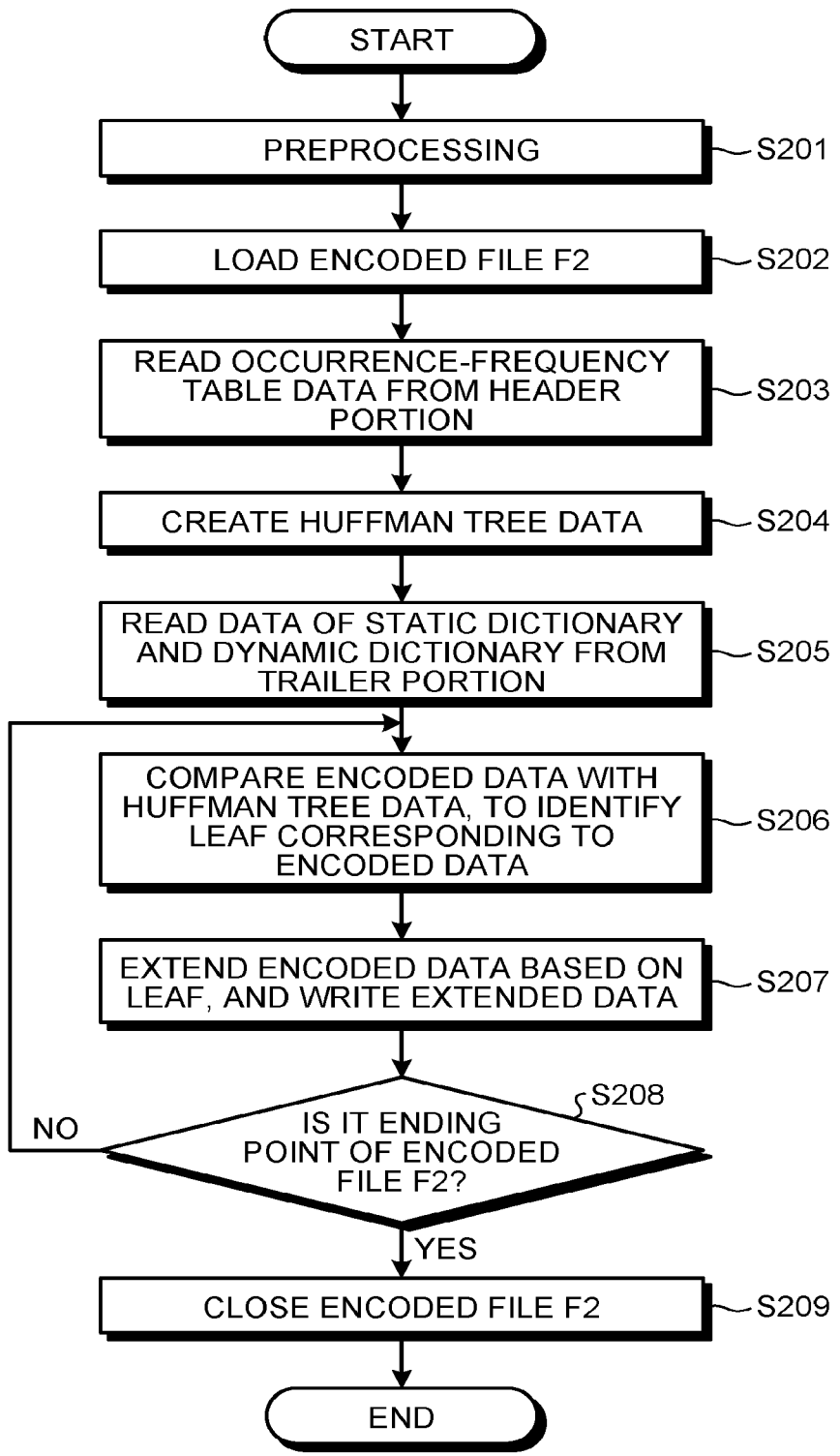
FIG. 13 is a flowchart depicting one example of a processing procedure of the extending unit according to the present embodiment.

Next, a processing procedure of the extending unit 100b according to the present embodiment is explained. FIG. 13 is a flowchart depicting one example of a processing procedure of the extending unit according to the present embodiment. As depicted in FIG. 13, the extending unit 100b performs preprocessing (step S201). In the preprocessing at step S201, the compressing unit 100a reserves a storage region in the storage unit 100c.

The file reading unit 204 of the extending unit 100b loads the encoded file F2 (step S202). The frequency-table reading unit 201 of the extending unit 100b reads the occurrence-frequency table data from the header portion of the encoded file F2 (step S203), and the Huffman-tree creating unit 202 creates the Huffman tree data 203 (step S204).

The file reading unit 204 reads the static dictionary and the dynamic dictionary from the trailer portion of the encoded file F2 (step S205). The extension processing unit 207 of the extending unit 100b compares the encoded data with the Huffman tree data 203, to identify a leaf corresponding to the encoded data (step S206).

The extension processing unit 207 extends the encoded data based on the leaf, and the file writing unit 208 writes the extension data in the extension file F3 (step S207). The extension processing unit 207 determines whether it has reached an ending point of the encoded file F2 (step S208). When it has not reached the ending point of the encoded file F2 (step S208: NO), the extension processing unit 207 shifts to step S206.

On the other hand, when it has reached the ending point of the encoded file F2 (step S208: YES), the extension processing unit 207 closes the encoded file F2 (step S209).

Next, an effect of the information processing device 100 according to the present embodiment is explained. The compressing unit 100a of the information processing device 100 performs dynamic encoding on text subjected to static encoding, creates the Huffman tree data 109 based on the occurrence frequency of a static code and a dynamic code, and encodes the text based on the Huffman tree data 109. In encoding based on the Huffman tree data 109, a code having a code length according to the occurrence frequency of the static code or the dynamic code is assigned. Therefore, according to the information processing device, encoding according to the occurrence frequency of a static code and a dynamic code can be performed.

Moreover, according to the information processing device 100, encoding and extension are performed by creating a Huffman tree based on the occurrence-frequency table data 107. Therefore, such an effect can be produced that an identification bit to distinguish which of a dynamic dictionary and a static dictionary is used is not added.

Figure 14:
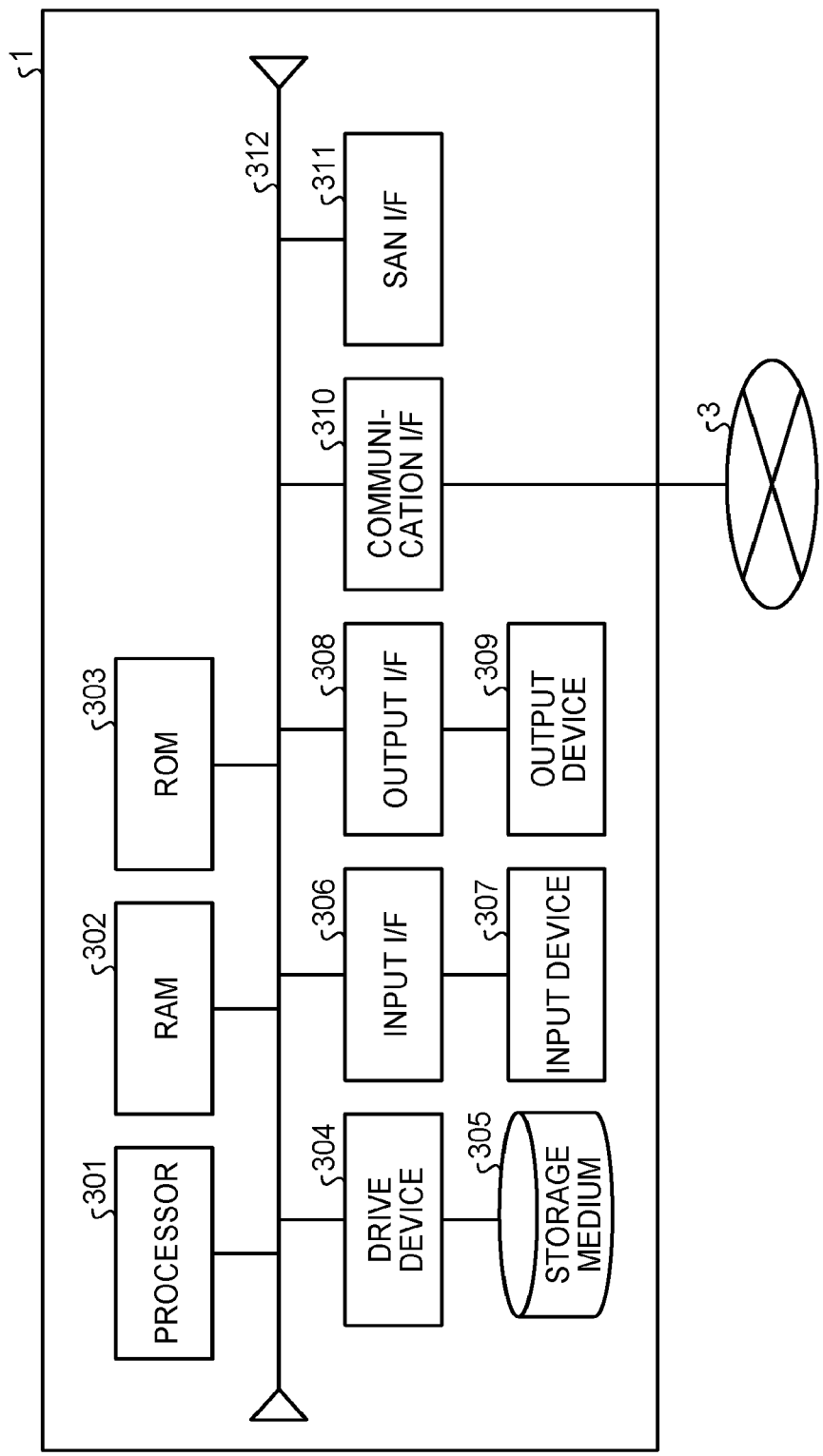
FIG. 14 depicts a hardware configuration of a computer.

In the following, hardware and software used in the present embodiment are explained. FIG. 14 depicts a hardware configuration of a computer. A computer 1 includes, for example, a processor 301, a random access memory (RAM) 302, a read only memory (ROM) 303, a drive device 304, a storage medium 305, an input interface (I/F) 306, an input device 307, an output I/F 308, an output device 309, a communication I/F 310, a storage area network (SAN) I/F 311, and a bus 312. Each hardware is connected through the bus 312.

The RAM 302 is a readable and writable memory device, and for example, a semiconductor memory such as a static RAM (SRAM) and a dynamic RAM (DRAM), or a flash memory not RAM, or the like is used. The ROM 303 includes a programmable ROM (PROM), and the like. The drive device 304 is a device that performs at least one of reading and writing of data recorded in the storage medium 305. The storage medium 305 stores data written by the drive device 304. The storage medium 305 is a recording medium such as a hard disk, a flash memory including a solid state drive (SSD), a compact disc (CD), a digital versatile disc (DVD), and a blue-ray disk. Moreover, for example, the computer 1 has the drive device 304 and the storage medium 305 for each of various kinds of storage media.

The input I/F 306 is connected to the input device 307, and is a circuit that transmits an input signal received from the input device 307 to the processor 301. The output I/F 308 is connected to the output device 309, and is a circuit that causes the output device 309 to perform an output according to an instruction from the processor 301. The communication I/F 310 is a circuit that controls communication through a network 3. The communication I/F 310 is, for example, a network interface card (NIC), or the like. The SAN I/F 311 is a circuit that controls communication with the storage device connected to the computer 1 by a storage area network. The SAN I/F 311 is, for example, a host bus adopter (HBA), or the like.

The input device 307 is a device that transmits an input signal according to an operation. The input device 307 is, for example, a key device such as a keyboard and a button arranged in a main unit of the computer 1, or a pointing device such as a mouse and a touch panel. The output device 309 is a device that outputs data according to a control by the computer 1. The output device 309 is, for example, an image output device (display device) such as a display, a sound output device such as a speaker, and the like. Moreover, for example, an input/output device such as a touch screen is used as the input device 307 and the output device 309. Furthermore, the input device 307 and the output device 309 may be integrated with a computer 1, or may be a device not included in the computer 1, and to be connected to the computer 1 externally.

For example, the processor 301 reads a program stored in the ROM 303 or the storage medium 305 to the RAM 302, and executes the processing of the compressing unit 100a or the processing of the extending unit 100b according to a procedure of the read program. At that time, the RAM 302 is used as a work area of the processor 301. The function of the storage unit 100c is implemented by the ROM 303 and the storage medium 305 storing a program file (an application program 24 described later, middleware 23, an operating system (OS) 22, and the like) or a data file (the file F1 to be compressed, the compressed encoded file F2, and the like), and by the RAM 302 used as a work area of the processor 301. The program read by the processor 301 is explained using FIG. 15.

Figure 15:
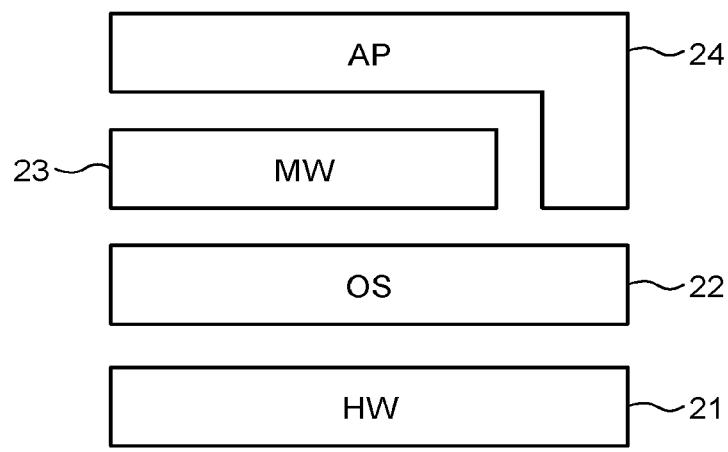
FIG. 15 depicts a configuration example of a program that operates on the computer.

FIG. 15 depicts a configuration example of a program that operates on the computer. In the computer 1, the OS 22 that controls a hardware group 21 (301 to 312) depicted in FIG. 15 operates. The control and management of the hardware group 21 is performed by the processor 301 acting in a procedure according to the OS 22, thereby executing the processing according to the application program 24 and the middleware 23 by the hardware group 21. Furthermore, in the computer 1, the middleware 23 or the application program 24 is read to the RAM 302 and executed by the processor 301.

When the compression function is called, the processor 301 performs processing based on at least a part of the middleware 23 or the application program 24 (performing the processing by controlling the hardware group 21 based on the OS 22), thereby implementing the function of the compressing unit 100a. Moreover, when the extension function is called, the processor 301 performs processing based on at least a part of the middleware 23 or the application program 24 (performing the processing by controlling the hardware group 21 based on the OS 22), thereby implementing the function of the extending unit 100b. The compression function and the extension function may be included in the application program 24 itself, or may be a part of the middleware 23 that is executed by being called according to the application program 24.

Figure 16:
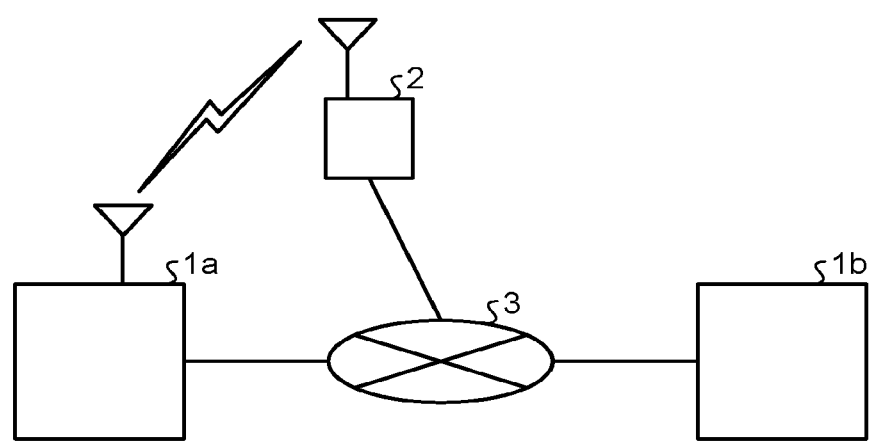
FIG. 16 depicts a configuration example of a device in a system of the embodiment.

FIG. 16 depicts a configuration example of a device in a system of the embodiment. The system depicted in FIG. 16 includes a computer 1a, a computer 1b, a base station 2, and the network 3. The computer 1a is connected to the network 3 connected to the computer 1b by at least one of wireless connection and wired connection.

The compressing unit 100a and the extending unit 100b depicted in FIG. 3 may be included in either of the computer 1a and the computer 1b depicted in FIG. 16. The computer 1b may include the compressing unit 100a and the computer 1a may include the extending unit 100b. Alternatively, both of the computer 1a and the computer 1b may have the compressing unit 100a and the extending unit 100b.

In the following, a modification of the embodiment described above is explained. Not limited to the following modification, design modification can be made appropriately within a range not departing from the gist of the present invention. A subject of the compression processing may be a monitoring message that is output from the system, and the like, besides data in a file. For example, processing of compressing a monitoring message that is sequentially stored in a buffer by the compression processing described above, and of storing it as a log file is performed. Moreover, compression may be performed per page in a database, or may be performed in a unit of multiple pages collectively.

Furthermore, data to be a subject of the above compression processing is not limited to character data as described above. It may be data with only numeric values, and the above compression processing may be applied to data such as an image and sound. For example, as for a file that contains a lot of data that is obtained by sound composition, it is expected that the compression rate is improved with the dynamic dictionary as lots of repetition is included in the data. Naturally, when only a part is used, partial extension enables to suppress extension processing. Moreover, a moving image that is taken by a fixed camera also includes lots of repetition as images of the respective frames are similar to each other. Therefore, by applying the compression processing described above, a similar effect as that of document data and sound data can be obtained.

Entropy encoding according to an occurrence frequency of a character string included in text data can be performed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
    first generating static-encoded data from input text data, utilizing a static dictionary that associates a character strings and static codes, respectively the static-encoded data including a plurality of static codes corresponding to a plurality of character strings that are registered in the static dictionary and character strings that are not registered in the static dictionary among the text data;
    second generating dynamic-encoded data from the static-encoded data by either encoding a character string that occurs more than once in the static-encoded data into a dynamic code or encoding a static code that occurs more than once in the static-encoded data;
    first creating a dynamic dictionary associating character strings or static codes with corresponding dynamic codes, respectively; and
    second creating a Huffman tree and data of a leaf in the Huffman tree based on an occurrence frequency of the dynamic codes and the static codes in the input text data.

2. The non-transitory computer-readable recording medium, according to claim 1, the process further comprising:
    encoding the dynamic codes and the static codes included in the dynamic-encoded data, based on the Huffman tree and the data of a leaf.

3. The non-transitory computer-readable recording medium, according to claim 1, wherein
    the second creating creates a Huffman tree in which codes length of codes corresponding to the dynamic codes and the static codes having a high occurrence frequency is shorter than codes length of codes corresponding to the dynamic codes and the static codes having a low occurrence frequency.

4. The non-transitory computer-readable recording medium, according to claim 1, the process further comprising:
    identifying an occurrence frequency of dynamic codes and an occurrence frequency of static codes included in the dynamic-encoded data; and
    storing data in which dynamic codes and an occurrence frequency of the dynamic codes are associated with each other, and data in which static codes and an occurrence frequency of the static codes are associated with each other.

5. An encoding method, comprising:
    first generating static-encoded data from input text data, utilizing a static dictionary that associates a character strings and static codes, respectively the static-encoded data including a plurality of static codes corresponding to a plurality of character strings that are registered in the static dictionary and character strings that are not registered in the static dictionary among the text data, using a processor;
    second generating dynamic-encoded data from the static-encoded data by either encoding a character string that occurs more than once in the static-encoded data into a dynamic code or encoding a static code that occurs more than once in the static-encoded data, using the processor;
    first creating a dynamic dictionary associating character strings or static codes with corresponding dynamic codes, respectively, using the processor; and
    second creating a Huffman tree and data of a leaf in the Huffman tree based on an occurrence frequency of the dynamic codes and the static codes in the input text data, using the processor.

6. The encoding method according to claim 5, further comprising
    encoding the dynamic codes and the static codes included in the dynamic-encoded data, based on the Huffman tree and the data of a leaf.

7. The encoding method according to claim 5, wherein
    the second creating creates a Huffman tree in which codes length of codes corresponding to the dynamic codes and the static codes having a high occurrence frequency is shorter than codes length of codes corresponding to the dynamic codes and the static codes having a low occurrence frequency.

8. The encoding method according to claim 5, further comprising:
identifying an occurrence frequency of dynamic codes and an occurrence frequency of static codes included in the dynamic-encoded data; and
storing data in which dynamic codes and an occurrence frequency of the dynamic codes are associated with each other, and data in which static codes and an occurrence frequency of the static codes are associated with each other.

9. An encoding device, comprising:
a processor that executes a process comprising:
first generating static-encoded data from input text data, utilizing a static dictionary that associates a character strings and static codes, respectively the static-encoded data including a plurality of static codes corresponding to a plurality of character strings that are registered in the static dictionary and character strings that are not registered in the static dictionary among the text data;
second generating dynamic-encoded data from the static-encoded data by either encoding a character string that occurs more than once in the static-encoded data into a dynamic code or encoding a static code that occurs more than once in the static-encoded data;
first creating a dynamic dictionary associating character strings or static codes with corresponding dynamic codes, respectively; and
second creating a Huffman tree and data of a leaf in the Huffman tree based on an occurrence frequency of the dynamic codes and the static codes in the input text data.

10. The encoding device according to claim 9, the process further comprising
encoding the dynamic codes and the static codes included in the dynamic-encoded data, based on the Huffman tree and the data of a leaf.

11. The encoding device according to claim 9, wherein
the second creating creates a Huffman tree in which codes length of codes corresponding to the dynamic codes and the static codes having a high occurrence frequency is shorter than codes length of codes corresponding to the dynamic codes and the static codes having a low occurrence frequency.

12. The encoding device according to claim 9, the process further comprising
identifying an occurrence frequency of dynamic codes and an occurrence frequency of static codes included in the dynamic-encoded data; and
storing data in which dynamic codes and an occurrence frequency of the dynamic codes are associated with each other, and data in which static codes and an occurrence frequency of the static codes are associated with each other.

13. A non-transitory computer-readable recording medium having stored therein a decoding program that causes a computer to execute a process comprising:
reading occurrence-frequency table data from a header portion of an encoded file to be input;
creating a Huffman tree and data of a leaf in the Huffman tree based on information relating to an occurrence frequency of dynamic codes and static codes obtained from the occurrence-frequency table data, wherein the dynamic codes include a dynamic code which is encoded from a character string that occurs more than once in a static-encodes data, a dynamic code which is encoded from a static code that occurs more than once in the static-encodes data, a dynamic code which is encoded from combination data including a character string and a static code that occur more than once in the static-encodes data; and
decoding an encoded file based on the Huffman tree, the data of a leaf in the Huffman tree, and encoded data included in the encoded file.

14. A decoding method, comprising:
reading occurrence-frequency table data from a header portion of an encoded file to be input, using a processor;
creating a Huffman tree and data of a leaf in the Huffman tree based on information relating to an occurrence frequency of dynamic codes and static codes obtained from the occurrence-frequency table data, wherein the dynamic codes include a dynamic code which is encoded from a character string that occurs more than once in a static-encodes data, a dynamic code which is encoded from a static code that occurs more than once in the static-encodes data, a dynamic code which is encoded from combination data including a character string and a static code that occur more than once in the static-encodes data, using the processor; and
decoding an encoded file based on the Huffman tree, the data of a leaf in the Huffman tree, and encoded data included in the encoded file, using the processor.

15. A decoding device, comprising:
a processor that executes a process comprising:
reading occurrence-frequency table data from a header portion of an encoded file to be input;
creating a Huffman tree and data of a leaf in the Huffman tree based on information relating to an occurrence frequency of dynamic codes and static codes obtained from the occurrence-frequency table data, wherein the dynamic codes include a dynamic code which is encoded from a character string that occurs more than once in a static-encodes data, a dynamic code which is encoded from a static code that occurs more than once in the static-encodes data, a dynamic code which is encoded from combination data including a character string and a static code that occur more than once in the static-encodes data; and
decoding an encoded file based on the Huffman tree, the data of a leaf in the Huffman tree, and encoded data included in the encoded file.

16. The non-transitory computer-readable recording medium, according to claim 1, wherein the second generating generates dynamic-encoded data from the static-encoded data by encoding a character string that occurs more than once in the static-encoded data into a dynamic code, by encoding a static code that occurs more than once in the static-encoded data into a dynamic code or by encoding a combination data into a dynamic code, the combination data including the character string and a static code that occur more than once.

17. The encoding method according to claim 5, wherein the second generating generates dynamic-encoded data from the static-encoded data by encoding a character string that occurs more than once in the static-encoded data into a dynamic code, by encoding a static code that occurs more than once in the static-encoded data into a dynamic code or by encoding a combination data into a dynamic code, the combination data including the character string and a static code that occur more than once.

18. The encoding device according to claim 9, wherein the second generating generates dynamic-encoded data from the static-encoded data by encoding a character string that occurs more than once in the static-encoded data into a dynamic code, by encoding a static code that occurs more than once in the static-encoded data into a dynamic code or by encoding a combination data into a dynamic code, the combination data including the character string and a static code that occur more than once.

* * * * *